US 11,035,911 B2

(12) United States Patent
Yamamoto et al.

(10) Patent No.: US 11,035,911 B2
(45) Date of Patent: Jun. 15, 2021

(54) MAGNETO-IMPEDANCE SENSOR

(71) Applicant: AICHI STEEL CORPORATION, Tokai (JP)

(72) Inventors: Michiharu Yamamoto, Aichi (JP); Tomohiko Nagao, Aichi (JP); Yoshihiro Iwanaga, Aichi (JP)

(73) Assignee: AICHI STEEL CORPORATION, Tokai (JP)

(*) Notice: Subject to any disclaimer, the term of this patent is extended or adjusted under 35 U.S.C. 154(b) by 328 days.

(21) Appl. No.: 16/304,195

(22) PCT Filed: May 31, 2017

(86) PCT No.: PCT/JP2017/020329
§ 371 (c)(1),
(2) Date: Nov. 23, 2018

(87) PCT Pub. No.: WO2017/213003
PCT Pub. Date: Dec. 14, 2017

(65) Prior Publication Data
US 2020/0319270 A1  Oct. 8, 2020

(30) Foreign Application Priority Data

Jun. 9, 2016  (JP) .............................. JP2016-114994

(51) Int. Cl.
*G01R 33/06* (2006.01)
(52) U.S. Cl.
CPC .................. *G01R 33/063* (2013.01)
(58) Field of Classification Search
None
See application file for complete search history.

(56) References Cited

U.S. PATENT DOCUMENTS 8,339,132 B2 * 12/2012 Honkura .............. G01R 33/063
                                                                  324/244
8,378,670 B1 *  2/2013 Honkura ................ G01R 33/18
                                                                  324/244
(Continued)

FOREIGN PATENT DOCUMENTS

CN       101815953 A       8/2010
CN       102544351 A       7/2012
(Continued)

OTHER PUBLICATIONS

Decision of Refusal dated Apr. 7, 2020 in corresponding Japanese Patent Application No. 2016-114994 (with English Translation), 7 pages.

(Continued)

*Primary Examiner* — Jermele M Hollington
(74) *Attorney, Agent, or Firm* — Oblon, McClelland, Maier & Neustadt, L.L.P.

(57) ABSTRACT

A magneto-impedance sensor which makes it possible to further improve the accuracy of external magnetic field measurement includes a magneto-impedance element, a detection circuit, a magneto-sensitive body wiring line and a conductive layer wiring line. The magneto-impedance element includes a magneto-sensitive body and a conductive layer adjacent to the magneto-sensitive body. The magneto-sensitive body and the conductive layer pass a current therethrough in the opposite directions. The magneto-sensitive body wiring line and the conductive layer wiring line are electrically connected to the magneto-sensitive body and the conductive layer, respectively. A detection coil and a detection circuit of the magneto-impedance element are electrically connected to each other through detecting conductive wires. At least parts of these lines are adjacent to (Continued)

each other and allow a current to pass therethrough in opposite directions.

17 Claims, 18 Drawing Sheets

(56) References Cited

U.S. PATENT DOCUMENTS

| | | | | |
|---|---|---|---|---|
| 10,620,276 | B2* | 4/2020 | Shimoto | H01L 43/08 |
| 2011/0089512 | A1* | 4/2011 | Honkura | G01R 33/18 |
| | | | | 257/427 |
| 2013/0038323 | A1* | 2/2013 | Honkura | G01R 33/18 |
| | | | | 324/244 |
| 2013/0181705 | A1* | 7/2013 | Honkura | G01R 33/063 |
| | | | | 324/252 |
| 2015/0153401 | A1 | 6/2015 | Tsujimoto | |
| 2015/0262748 | A1* | 9/2015 | Nishihata | H01F 27/29 |
| | | | | 336/192 |
| 2016/0116551 | A1* | 4/2016 | Honkura | G01R 33/063 |
| | | | | 324/258 |

FOREIGN PATENT DOCUMENTS

| | | |
|---|---|---|
| CN | 104412116 A | 3/2015 |
| CN | 104459571 A | 3/2015 |
| CN | 204241670 U | 4/2015 |
| EP | 2 860 537 A1 | 4/2015 |
| JP | 2001-133530 A | 5/2001 |
| JP | 2004-264156 A | 9/2004 |
| JP | WO 2009/044820 A1 | 4/2009 |
| JP | 2009-139182 A | 6/2009 |

OTHER PUBLICATIONS

Combined Chinese Office Action and Search Report dated Jul. 14, 2020, in Patent Application No. 201780035624.9 (with English translation), citing documents AO-AS therein, 16 pages.

Japanese Office Action dated Jan. 7, 2020 in Japanese Patent Application No. 2016-114994 (with unedited computer generated English translation), 6 pages.

International Preliminary Report on Patentability and Written Opinion dated Dec. 20. 2018 in PCT/JP2017/020329 (English Translation only), 8 pages.

International Search Report dated Aug. 29, 2017 in PCT/JP2017/020329 filed May 31, 2017.

Extended European Search Report dated May 7, 2019 in European Patent Application No. 17810181.2; citing document AO therein, 14 pages.

* cited by examiner

MAGNETO-IMPEDANCE SENSOR

TECHNICAL FIELD

The present invention relates to a magneto-impedance sensor provided with a magneto-impedance element, and a detection circuit connected to the magneto-impedance element. In particular, it relates to a magneto-impedance sensor that makes it possible to greatly improve the accuracy of external magnetic field measurement.

BACKGROUND ART

In the past, a magneto-impedance sensor (hereinafter, also referred to as an MI sensor) provided with a magneto-impedance element (hereinafter, also referred to as an MI element), and a detection circuit connected to the MI element has been known. The MI element includes a magneto-sensitive body composed of an amorphous wire, and a detection coil wound around the magneto-sensitive body. The detection circuit is connected to the detection coil of the MI element.

In the MI sensor, a current such as a pulse current, or the like is supplied to the magneto-sensitive body to detect an external magnetic field. When the current largely varies with time, a voltage corresponding to an intensity of the external magnetic field that acts on the magneto-sensitive body generates in the detection coil. The MI sensor is configured to detect this voltage by the detection circuit to thereby calculate the intensity of the external magnetic field.

An MI sensor is known as a magnetic sensor with high measurement accuracy. However, users' demand for measurement accuracy has become more severe over time, and study of further improvement in measurement accuracy has been desired. Under such a background, as to the possibility whether the following error factor may cause deterioration of the measurement accuracy, various reviews were performed. Specifically, when a current is supplied to the magneto-sensitive body, the current generates a magnetic field therearound and the magnetic field acts on the detection coil. When the current varies with time, the magnetic field that acts on the detection coil varies with time, so that the detection coil generates an induced voltage independently from the intensity of the external magnetic field. Thus, there is a possibility that the output voltage of the detection coil may have the induced voltage superposed thereon, which affects the measurement to cause any measurement errors and thereby degrades the accuracy of external magnetic field measurement. Therefore, in order to further enhance the measurement accuracy, detailed study about measures for minimizing such an error factor of the measurement, is considered necessary.

In order to cope with this problem, the method described in Patent Document 1 as below has been proposed. This document describes an MI element characterized in that a magneto-sensitive body is covered with a conductive layer with an insulating layer being interposed therebetween, and the magneto-sensitive body and the conductive layer are electrically connected by a connecting part at one ends thereof in the axial direction of the magneto-sensitive body. According to such a configuration, a current flows through the inside of the magneto-sensitive body from the side of the other end to the side of the one end in the axial direction, thereafter, passes through the connecting part, and thereafter flows inside the conductive layer from the side of the one end to the side of the other end. Consequently, the direction of the current flowing in the magneto-sensitive body and the direction of the current flowing in the conductive layer are opposite to each other, so that the magnetic fields generated by the current can be cancelled by each other. Therefore, the magnetic field generated from the magneto-sensitive body hardly acts on the detection coil, and thus an induced voltage is hardly generated in the detection coil. Thus, the external magnetic field can be accurately measured.

PRIOR ART LITERATURE

Patent Document

Patent Document 1 WO 2009/044820

SUMMARY OF THE INVENTION

Problem to be Solved by the Invention

However, further study proved that the accuracy of external magnetic field measurement cannot be satisfactorily improved by the above-mentioned measure in some cases. Specifically, the detection coil and the detection circuit are connected to each other through a pair of detecting conductive wires. Further, the MI sensor is provided with a magneto-sensitive body wiring line for connecting the magneto-sensitive body and a power source, and a conductive layer wiring line for connecting the conductive layer and the power source. However, in the MI sensor, although an influence of the magnetic field that results from the current flowing in the magneto-sensitive body per se was considered, satisfactory reduction of the magnetic field that results from the current flowing in the magneto-sensitive body wiring line, and the magnetic field that results from the conductive layer wiring line was not considered. Consequently, there found a possibility that these magnetic fields may act on the pair of detecting conductive wires to thereby generate an induced voltage in the detecting conductive wires. Thus, it was found that there occurs a possibility that the induced voltage may be superposed on the output voltage of the detection coil, so that the accuracy of external magnetic field measurement cannot be always satisfactorily improved.

The present invention has been made in view of such a background, and it is intended to provide a magneto-impedance sensor that makes it possible to further improve the accuracy of external magnetic field measurement.

Means for Solving the Problem

One aspect of the present invention is a magneto-impedance sensor, including:

a magneto-impedance element that includes a magneto-sensitive body, a conductive layer arranged at a position adjacent to the magneto-sensitive body with an insulating layer being interposed therebetween, a detection coil wound around the magneto-sensitive body, a connecting part electrically connecting the magneto-sensitive body and the conductive layer at one ends thereof in an axial direction of the magneto-sensitive body, a magneto-sensitive body terminal portion electrically connected to an other end of the magneto-sensitive body in the axial direction, and a conductive layer terminal portion electrically connected to an other end of the conductive layer in the axial direction, and that is configured to allow the magneto-sensitive body and the conductive layer to pass a current therethrough in opposite directions;

a detection circuit electrically connected to the detection coil through a pair of detecting conductive wires to detect an output voltage of the detection coil;

a magneto-sensitive body wiring line electrically connected to the magneto-sensitive body terminal portion; and a conductive layer wiring line electrically connected to the conductive layer terminal portion, wherein two wiring lines of the magneto-sensitive body wiring line and the conductive layer wiring line are configured such that at least parts of the two wiring lines are adjacent to each other and allow the current to pass therethrough in opposite directions.

Effects of the Invention

In the MI sensor, the two wiring lines of the magneto-sensitive body wiring line and the conductive layer wiring line are configured such that at least parts of the two wiring lines are adjacent to each other and allow a current to pass therethrough in opposite directions.

Such configuration makes it possible that the magnetic field generated by the current flowing in the magneto-sensitive body wiring line and the magnetic field generated by the current flowing in the conductive layer wiring line are cancelled with each other. Thus, it can be prevented that these magnetic fields act on the pair of detecting conductive wires to thereby generate an induced voltage in the detecting conducting wires. As a result, it becomes possible to accurately measure the output voltage of the detection coil by the detection circuit. In this way, the accuracy of external magnetic field measurement can be improved.

As mentioned above, the present aspect can provide a magneto-impedance sensor that makes it possible to further improve the accuracy of external magnetic field measurement.

Here, the description, "the two wiring lines are adjacent to each other" mentioned above, can be defined as, for example, a state where the two wiring lines are arranged adjacently to each other within a range up to 10 times the wiring width. When the two wiring lines differ in wire width, the shorter width is used as a basis. Further, the two wiring lines are more preferably arranged adjacently to each other within a range up to 5 times the wiring width, and still more preferably within a range up to twice the wiring width.

MODES FOR CARRYING OUT THE INVENTION

Figure 1:
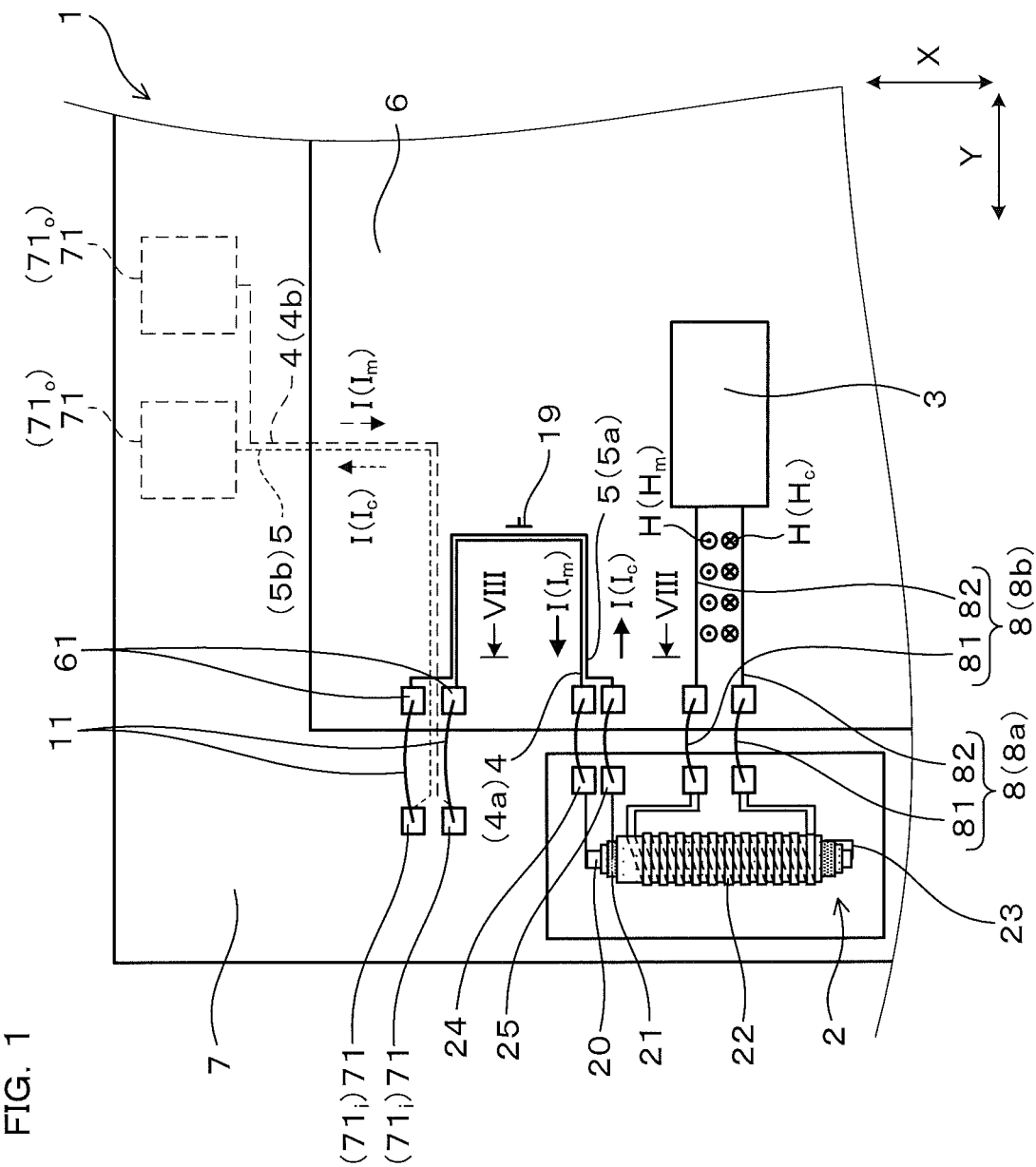
FIG. 1 is a plan view of a magneto-impedance sensor according to Embodiment 1.

It is preferable that the magneto-impedance sensor is configured to further include an IC in which the detection circuit is formed, and a wiring board on which the magneto-impedance element and the IC is mounted, each of the two wiring lines being composed of an IC part formed on the IC and a board part formed on the wiring board, and the two wiring lines being configured to be adjacent to each other both in the IC parts and the board parts.

In this case, the adjacent parts of the two wiring lines may be made long in length. According to such a configuration, magnetic fields generated by the current flowing in these wiring lines can be satisfactorily cancelled with each other to thereby lower the intensity of the magnetic field that acts on the pair of detecting conductive wires. Consequently, an induced voltage is hardly generated in the detecting conductive wires, which makes it possible to measure the external magnetic field more accurately.

Further, it is preferable that the two wiring lines are adjacent to each other in a thickness direction of the IC in at least either of the IC parts or the board parts.

In this case, because the two wiring lines are adjacent to each other in the thickness direction, dimensions of the IC and/or the wiring board viewed in the thickness direction can be reduced. Therefore, the magneto-impedance sensor can be small-sized.

Still further, it is preferable that the magneto-sensitive body wiring line and the conductive layer wiring line are formed at such positions as not to cross with the detecting conductive wires when viewed in the thickness direction of the IC.

In this case, the magneto-sensitive body wiring line and the conductive layer wiring line can be arranged at the positions apart from the pair of the detecting conductive wires. Such a configuration prevents the magnetic fields generated from these wiring lines from generating an induced voltage in the detecting conductive wires, which makes it possible to measure the external magnetic field more accurately.

Still further, it is preferable that wires lie between the magneto-sensitive body terminal portion and the magneto-sensitive body wiring line, and between the conductive layer terminal portion and the conductive layer wiring line, respectively to electrically connect therebetween, the wires being formed at such positions as not to cross with the detecting conductive wires when viewed in the thickness direction of the IC.

In this case, the wires can be arranged at the positions apart from the detecting conductive wires. Accordingly, magnetic fields generated by the wires hardly act on the pair of detecting conductive wires, and thus an induced voltage is hardly generated in the detecting conductive wires. Therefore, it becomes possible to measure the external magnetic field more accurately.

Still further, it is preferable that both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

In this case, the adjacent parts of the two wiring lines may be made longer in length. According to such a configuration, magnetic fields generated by the current flowing in the two wiring lines can be effectively cancelled with each other. Consequently, an induced voltage is hardly generated in the detecting conductive wires, which makes it possible to measure the external magnetic field more accurately.

In this case, the adjacent parts of the two wiring lines may be made longer in length. According to such a configuration, magnetic fields generated by the current flowing in the two wiring lines can be effectively cancelled with each other. Consequently, an induced voltage is hardly generated in the detecting conductive wires, which makes it possible to measure the external magnetic field more accurately.

Embodiment 1

Figure 2:
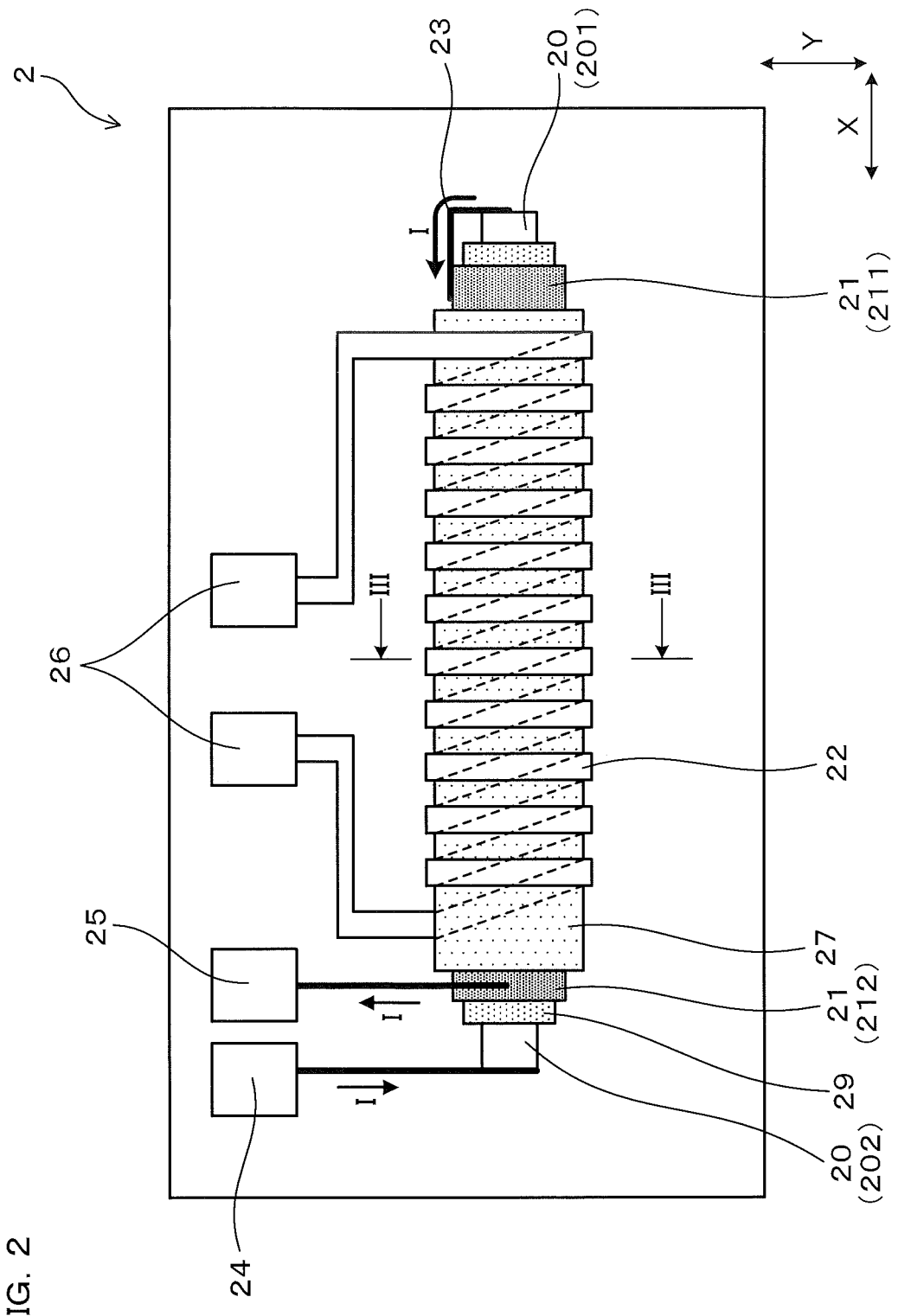
FIG. 2 is a plan view of a magneto-impedance element according to Embodiment 1.
Figure 3:
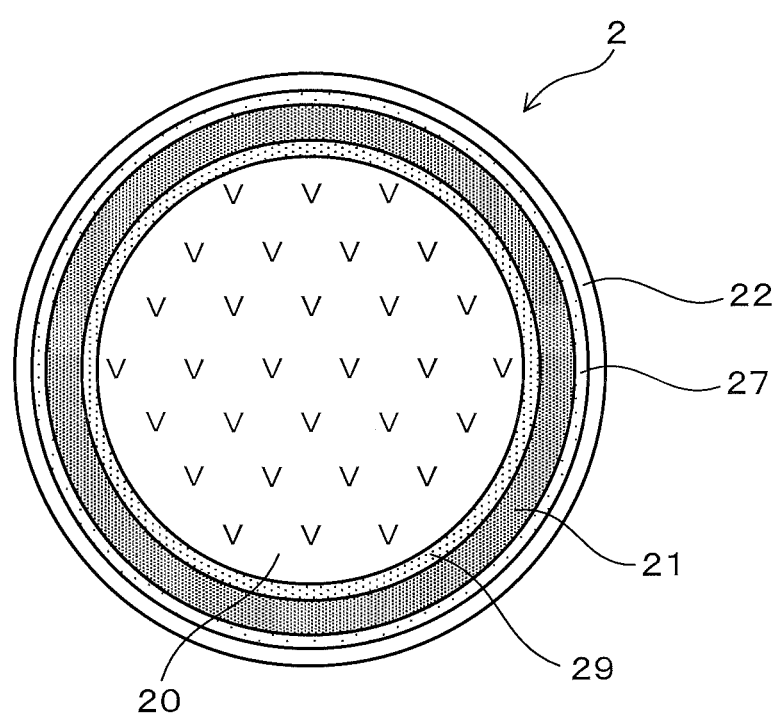
FIG. 3 is a cross-sectional view taken along the line III-III in FIG. 2.

An embodiment of the magneto-impedance sensor will be explained with reference to FIG. 1 to FIG. 12. As shown in FIG. 1, a magneto-impedance sensor 1 (an MI sensor 1) of the present embodiment includes a magneto-impedance element 2 (an MI element 2), a detection circuit 3, a magneto-sensitive body wiring line 4, and a conductive layer wiring line 5. As shown in FIG. 2 and FIG. 3, the MI element 2 includes a magneto-sensitive body 20, a conductive layer 21, a detection coil 22, a connecting part 23, a magneto-sensitive body terminal portion 24, and a conductive layer terminal portion 25.

The conductive layer 21 is formed in a cylindrical shape, and is arranged at the position adjacent to the magneto-sensitive body 20 with an insulating layer 29 being interposed therebetween. The detection coil 22 is wound around the magneto-sensitive body 20 with a coil insulating layer 27 being interposed therebetween. As shown in FIG. 2, the connecting part 23 electrically connects the magneto-sensitive body 20 and the conductive layer 21 at one ends 201 and 211 in the axial direction (X direction) of the magneto-sensitive body 20. The magneto-sensitive body terminal portion 24 is electrically connected to an other end 202 of the magneto-sensitive body 20 in the X direction. The conductive layer terminal portion 25 is electrically connected to an other end 212 of the conductive layer 21 in the X direction. Thus, the magneto-sensitive body 20 and the conductive layer 21 are configured to pass a current therethrough in opposite directions, respectively.

As shown in FIG. 1, the detection circuit 3 is electrically connected to the detection coil 22 through a pair of detecting conductive wires 8 (8a and 8b). The detection circuit 3 is provided to detect the output voltage of the detection coil 22. The magneto-sensitive body wiring line 4 is electrically connected to the magneto-sensitive body terminal portion 24. The conductive layer wiring line 5 is electrically connected to the conductive layer terminal portion 25.

The two wiring lines 4 and 5 of the magneto-sensitive body wiring line 4 and the conductive layer wiring line 5 are at least partly adjacent to each other. More specifically, the two wiring lines 4 and 5 are adjacent to each other except for the vicinity of the terminal portions. And, the two wiring lines 4 and 5 are configured to pass a current I therethrough in opposite directions.

As shown in FIG. 1, the MI sensor 1 of the present embodiment is provided with an IC 6 and a wiring board 7. The IC 6 has the detection circuit 3, wiring lines 4a and 5a, etc. formed thereon. The detection circuit 3 includes a sample-hold circuit (not shown) for holding the output voltage of the detection coil 22 for a predetermined period, an A/D converter (not shown) for converting the output voltage thus held into a digital value, and other components.

The wiring board 7 has the MI element 2 and the IC 6 mounted thereon. The two wiring lines 4 and 5, i.e. the magneto-sensitive body wiring line 4 and the conductive layer wiring line 5 include the IC parts 4a and 5a respectively, which are formed on the IC 6, and the board parts 4b and 5b respectively, which are formed on the wiring board 7. The IC parts including 4a and 5a, and the board parts including 4b and 5b are electrically connected to each other through board connecting wires 11. And the two wiring lines 4 and 5 are adjacent to each other both in the IC parts 4a and 5a and in the board parts 4b and 5b. The two IC parts 4a and 5a have the same wiring width. Also, the two board parts 4b and 5b have the same wiring width.

As shown in FIG. 1, the detecting conductive wires 8 (8a and 8b) include IC conductive wire parts 82 that are formed on the IC 6, and detecting wires 81 that are disposed between the IC conductive wire parts 82 and the detection coil 22. The detection coil 22 and the detection circuit 3 are electrically connected through the detecting conductive wires 8.

As shown in FIG. 2 and FIG. 3, the MI element 2 includes, as mentioned above, the magneto-sensitive body 20, the insulating layer 29, the conductive layer 21, and the coil insulating layer 27. The insulating layer 29 covers the surface of the magneto-sensitive body 20. The conductive layer 21 covers the surface of the insulating layer 29. The surface of the conductive layer 21 is covered with the coil insulating layer 27. The detection coil 22 is wound on the outside of the coil insulating layer 27.

As shown in FIG. 2, the one end 201 of the magneto-sensitive body 20 and the one end 211 of the conductive layer 21 in the X direction are electrically connected by the connecting part 23. The connecting part 23 is made of metal. When the current I is supplied from the magneto-sensitive body terminal portion 24, the current I flows through the inside of the magneto-sensitive body 20 from the other end 202 to the one end 201, thereafter, passes through the connecting part 23, and thereafter flows through the inside of the conductive layer 21 from the one end 211 to the other end 212. In this way, the flowing direction of the current I that flows to the magneto-sensitive body 20 and the flowing direction of the current I that flows to the conductive layer 21 are opposite to each other. Thus, the magnetic field generated around the current I flowing through the inside of the magneto-sensitive body 20 and the magnetic field generated around the current I flowing through the inside of the conductive layer 21 are cancelled with each other. Thus, the influence of these magnetic fields on the detection coil 22 and the detecting conductive wires 8 is made reduced.

Figure 4:
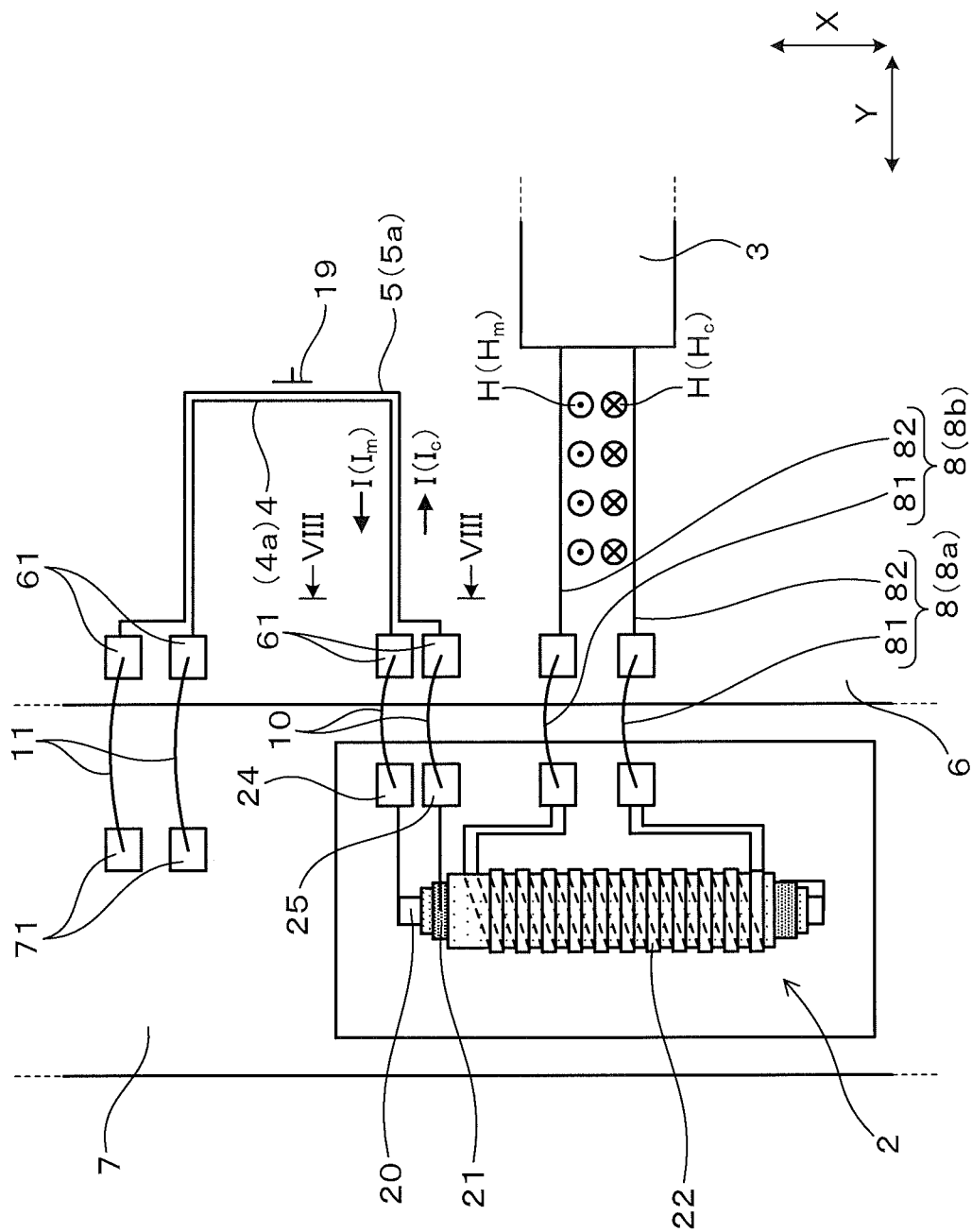
FIG. 4 is an enlarged view of a substantial part of FIG. 1.

As shown in FIG. 4, the magneto-sensitive body wiring line 4 and the conductive layer wiring line 5 allow the current I to pass therethrough in opposite directions. In the present embodiment, the magneto-sensitive body wiring line 4 and the conductive layer wiring line 5 are formed at the positions adjacent to each other. According to such a configuration, the magnetic field $H_m$ generated by the current I ($I_m$) flowing through the magneto-sensitive body wiring line 4 and the magnetic field $H_c$ generated by the current I ($I_c$) flowing through the conductive layer wiring line 5 are cancelled with each other to thereby prevent these magnetic fields $H_m$ and $H_c$ from acting on the pair of detecting conductive wires 8a and 8b. Consequently, when the currents $I_m$ and $I_c$ vary with time, and then the magnetic fields $H_m$ and $H_c$ vary with time, the pair of the detecting conductive wires 8a and 8b are prevented from having a large induced voltage generated therein.

Figure 9:
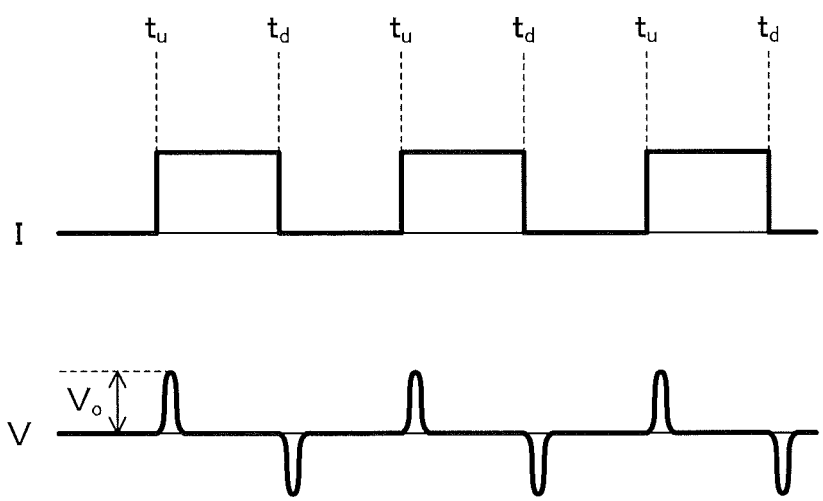
FIG. 9 is a waveform chart showing a current flowing in a magneto-sensitive body on which an external magnetic field acts, and a voltage of a detection coil in Embodiment 1.

To measure an external magnetic field by the MI sensor 1, as shown in FIG. 9, the current I is supplied to the magneto-sensitive body 20. The current I is, for example, an alternating current such as a pulse current, or the like. At the times when a pulse current I is risen (time $t_u$) and fallen (time $t_d$), an output voltage $V_o$ is generated in the detection coil 22. This output voltage $V_o$ is proportional to the magnitude of the external magnetic field that acts on the magneto-sensitive body 20.

Figure 10:
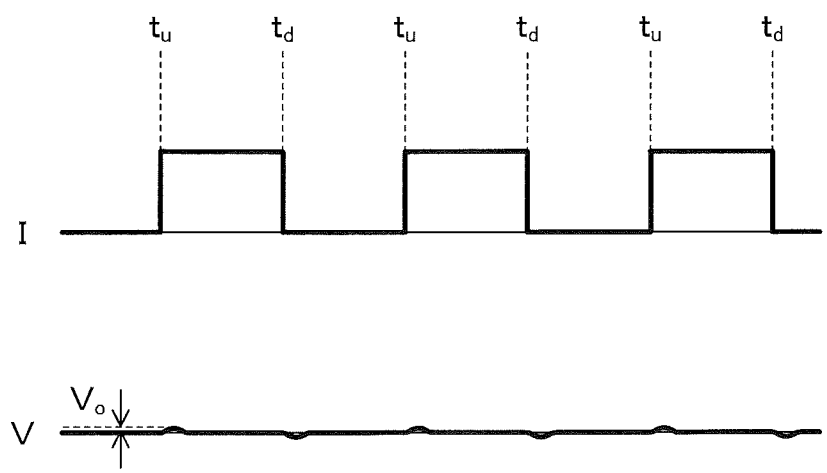
FIG. 10 is a waveform chart showing a current flowing in a magneto-sensitive body on which no external magnetic field acts, and a voltage of a detection coil in Embodiment 1.

In the present embodiment, as mentioned above, the magneto-sensitive body 20 and the conductive layer 21 are arranged adjacently to each other, and thus the magnetic fields generated by the current I flowing therethrough are cancelled. Therefore, at the time when the magnetic field generated by the current I varies with time (time $t_u$, $t_d$), for example, the time when the current I is risen, the time when the current is fallen and such, generation of an induced voltage in the detection coil 22, which would be caused by the variation of the current I can be prevented. Further, in the present embodiment, the magneto-sensitive body wiring line 4 and the conductive layer wiring line 5 are arranged adjacently to each other, and thus the magnetic fields $H_m$ and $H_c$ generated by the currents $I_m$ and $I_c$ flowing through these wiring lines 4 and 5 respectively, are cancelled with each other. Accordingly, at the time when these magnetic fields $H_m$ and $H_c$ vary with time (time $t_u$, $t_d$), generation of an induced voltage in the detecting conductive wires 8 (8a and 8b) is prevented. In this way, the configuration is such that the external magnetic field can be accurately measured avoiding large influence of the induced voltage. For example, as shown in FIG. 10, in case a magnetic field is detected under the condition that no external magnetic field acts on the magneto-sensitive body 20, the magnetic fields that resulted from the current flowing through the magneto-sensitive body 20, the conductive layer 21, and the wiring lines 4 and 5 give almost no influence, and thus the output voltage caused by these magnetic fields and detected by the detection circuit 3 becomes almost zero.

Next, the structure of the IC 6 will be explained. As shown in FIG. 4, the IC 6 has the detection circuit 3, the IC conductive wire parts 82 of the detecting conductive wires 8, a plurality of IC terminal portions 61, and the IC parts 4a and 5a of the wiring lines 4 and 5 formed thereon. Both ends of the IC parts 4a and 5a are connected to the IC terminal portions 61. The IC parts 4a and 5a of the two wiring lines 4 and 5 are adjacent to each other except for the vicinity of the IC terminal portions 61.

Figure 8:
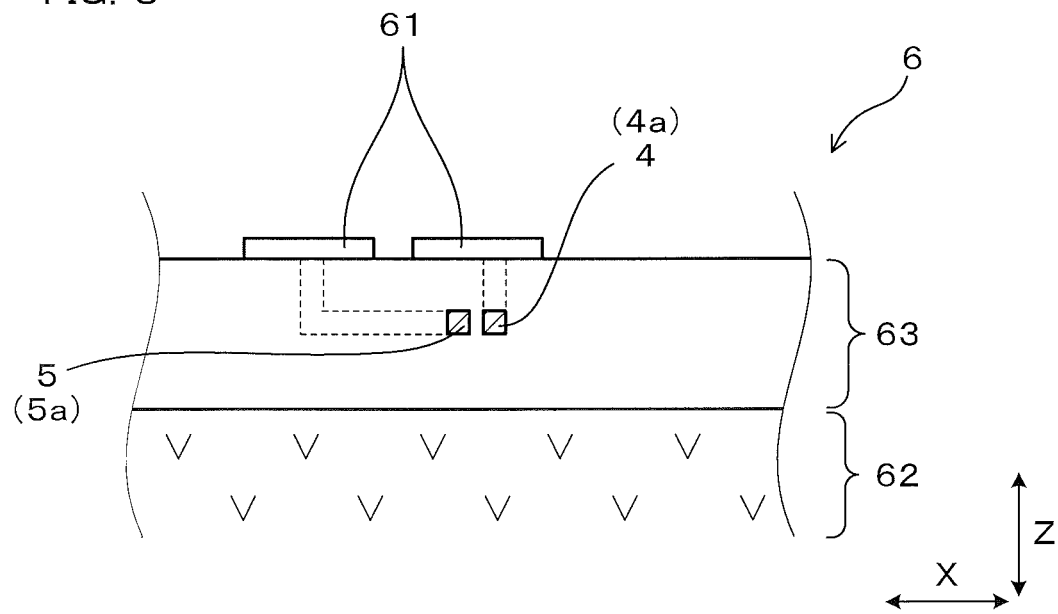
FIG. 8 is a cross-sectional view taken along the line VIII-VIII in FIG. 4.

The IC parts 4a and 5a of the wiring lines 4 and 5 are provided with a switch 19. It is configured that upon ON-OFF operation of the switch 19, current application and non-current application to the magneto-sensitive body 20 are switched. As shown in FIG. 8, the IC 6 includes a silicon substrate 62 and a wiring part 63 formed on the surface of the silicon substrate 62. The wiring part 63 has the IC parts 4a and 5a of the two wiring lines 4 and 5 formed thereon. In the present embodiment, the IC parts 4a and 5a of the two wiring lines 4 and 5 are adjacent to each other in the direction orthogonal to the thickness direction of the IC 6 (Z direction).

Figure 5:
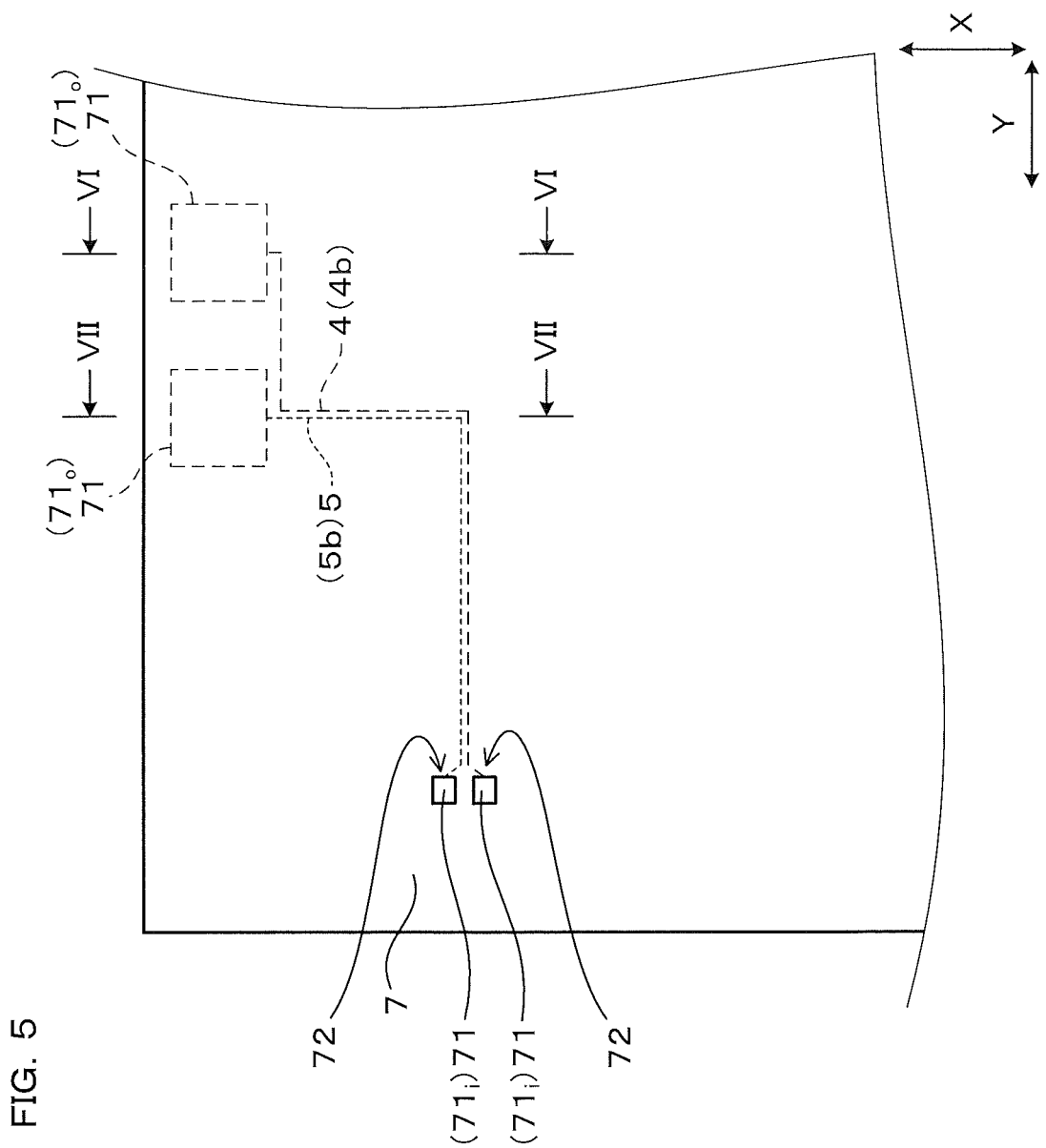
FIG. 5 is a plan view of a wiring board according to Embodiment 1.

Next, the structure of the wiring board 7 will be explained. As shown in FIG. 5, the wiring board 7 is provided with a plurality of board terminal portions 71, and the board parts 4b and 5b of the wiring lines 4 and 5. Both ends of the board parts 4b and 5b of the wiring lines 4 and 5 are connected to the board terminal portions 71. The board parts 4b and 5b of the two wiring lines 4 and 5 are adjacent to each other except for the vicinity of the board terminal portions 71. Thus, the magnetic fields generated by the current I flowing through the board parts 4b and 5b are cancelled with each other. According to such a configuration, the magnetic fields generated from the board parts 4b and 5b are prevented from acting on the detecting conductive wires 8 (8a and 8b) and generating an induced voltage in the detecting conductive wires 8. In this way, the external magnetic fields can be measured more accurately.

Figure 6:
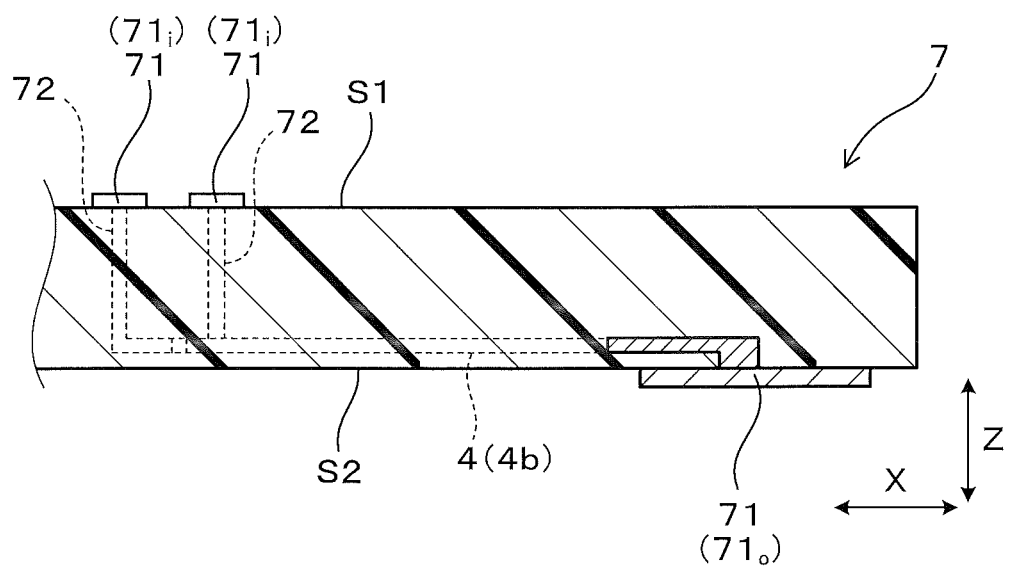
FIG. 6 is a cross-sectional view taken along the line VI-VI in FIG. 5.
Figure 7:
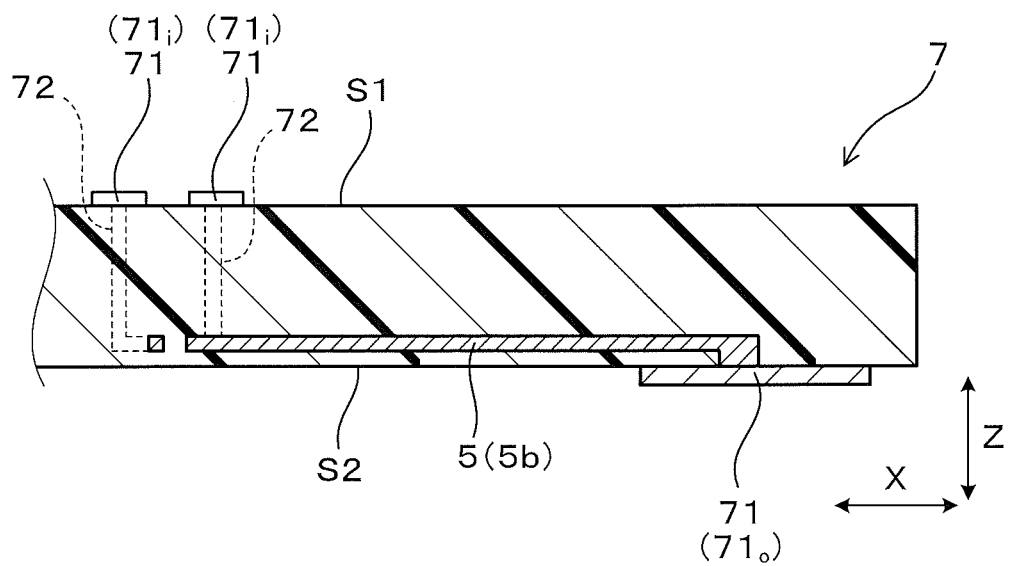
FIG. 7 is a cross-sectional view taken along the line VII-VII in FIG. 5.

Further, the board terminal portions 71 includes IC side board terminal portions 71$_i$ connected to the IC 6, and outside board terminal portions 71$_o$ connected to an external equipment such as a power supply, or the like. The IC side board terminal portions 71$_i$ are connected to the IC terminal portions 61 of the IC 6 through the board connecting wires 11. As shown in FIG. 6 and FIG. 7, the IC side board terminal portions 71$_i$ are formed on a first primary surface S1, a primary surface of the wiring board 7 on which the IC 6 and the MI element 2 are mounted. The outside board terminal portions 71$_o$ are formed on a second primary surface S2, a primary surface reverse to the first primary surface S1.

Still further, as shown FIG. 5, the board parts 4b and 5b of the two wiring lines 4 and 5 are adjacent to each other in the direction orthogonal to the Z direction. As shown in FIG. 6 and FIG. 7, the positions of these board parts 4b and 5b in the Z direction are the same. In addition, on the wiring board 7, contact portions 72 are formed extendingly in the Z direction. The board parts 4b and 5b of the wiring lines 4 and 5 are connected to the IC side board terminal portions 71$_i$ through the contact portions 72.

It is noted that the board parts 4b and 5b may be formed on the first primary surface S1 or the second primary surface S2.

Experiments to confirm the effects of the present invention were conducted, which will be explained below. First, the MI sensor 1 shown in FIG. 1 was prepared as a sample 1 that falls within the scope of the present invention. Specifically, in the sample 1, the MI element 2 was used, which is provided with the magneto-sensitive body 20, and the conductive layer 21 adjacent to the magneto-sensitive body 20, and is configured to allow the magneto-sensitive body 20 and the conductive layer 21 to pass a current therethrough in opposite directions. The IC parts 4a and 5a of the wiring lines 4 and 5 were adjacent to each other, and the board parts 4b and 5b of the wiring lines 4 and 5 were adjacent to each other.

Figure 19:
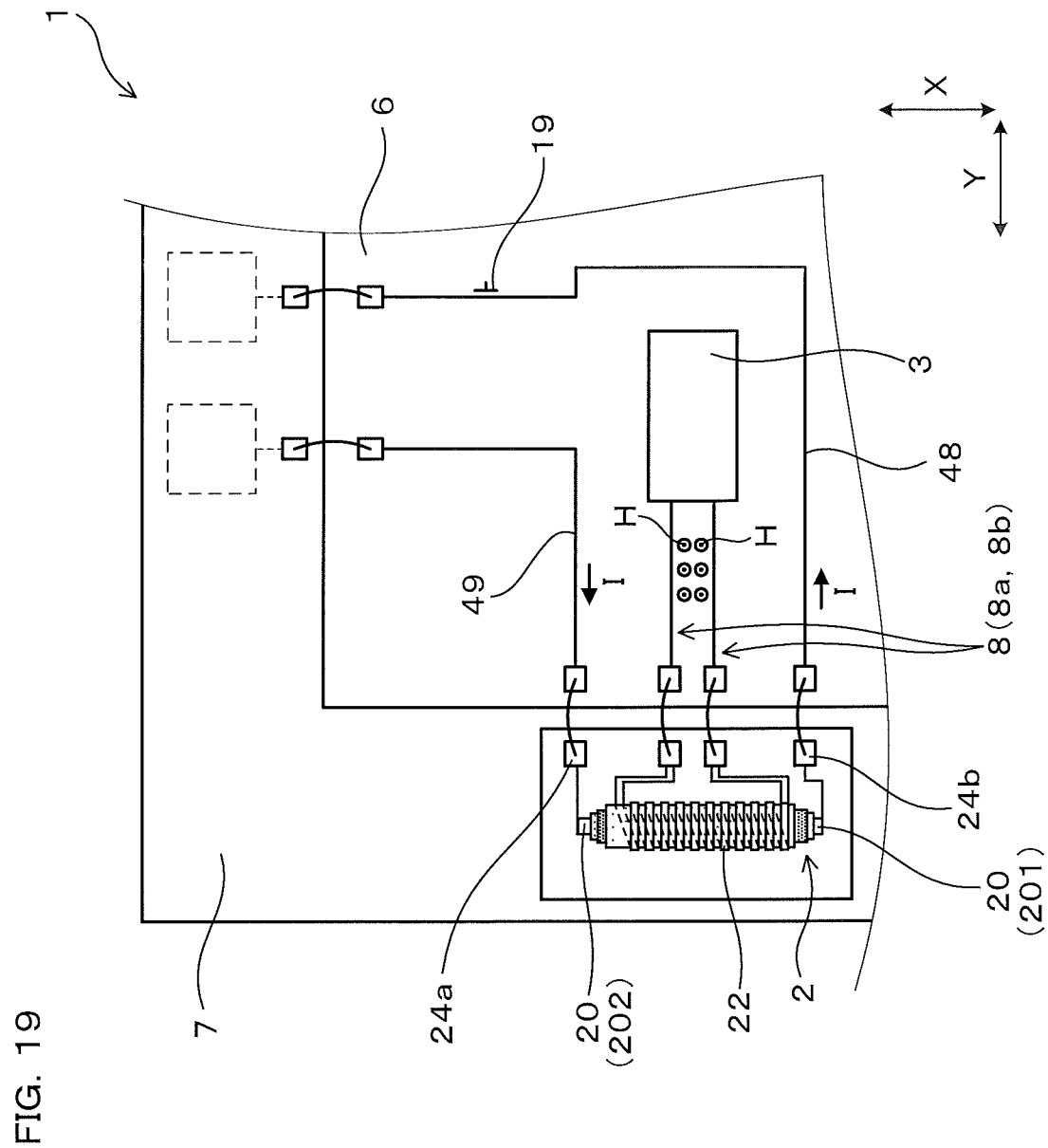
FIG. 19 is a plan view of the magneto-impedance sensor according to Comparative Embodiment 1.

Further, as shown in FIG. 19, using the MI element 2 having no conductive layer 21, a comparative sample 1 of the MI sensor 1, which is out of the scope of the present invention, was manufactured. In the comparative sample 1, the one end 201 and the other end 202 of the magneto-sensitive body 20 were connected to the wiring lines 48 and 49, respectively. According to such a configuration, the distance between these wiring lines 48 and 49 is larger than that in the sample 1, and the two wiring lines 48 and 49 are not adjacent to each other.

Figure 11:
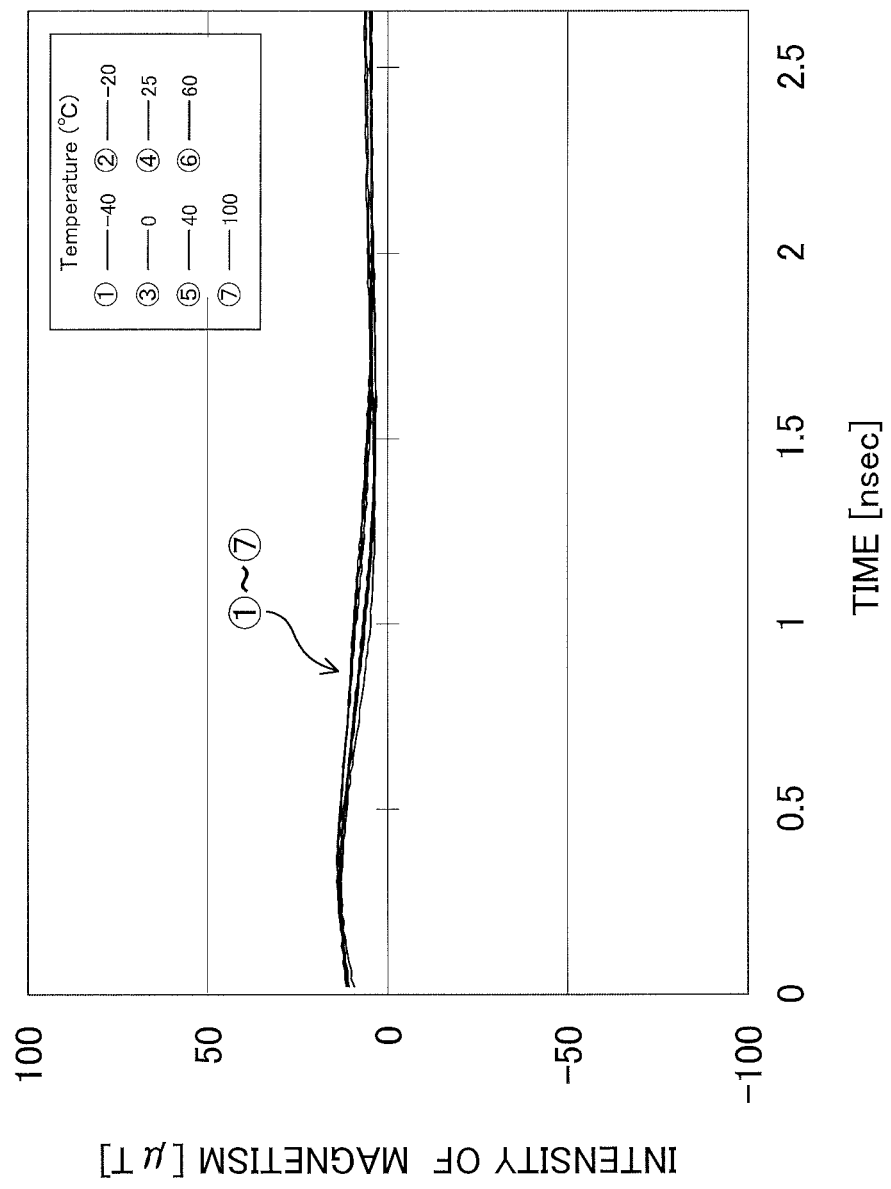
FIG. 11 shows a measurement result of the output voltage of the detection coil according to Embodiment 1.

The sample 1 and the comparative sample 1 were placed in experimental equipment shielded from external magnetic fields, and the pulse current I is supplied to the magneto-sensitive body 20. Then, the time variation of the output voltage $V_o$ of the detection coil 22 after the pulse current I had been risen, was measured. The temperatures of the sample 1 and the comparative sample 1 were conditioned to be −40° C., −20° C., 0° C., 25° C., 40° C., 60° C., and 100° C., and the time variation of the intensity of magnetism corresponding to the output voltage $V_o$ for each temperature was measured. The measurement results of the sample 1 are shown in FIG. 11. Meanwhile, the measurement results of the comparative sample 1 are shown in FIG. 20.

As shown in FIG. 11, in the sample 1 of the present invention, the peak value of the output voltage $V_o$ is relatively small. The reason is considered as follows. That is, the magnetic field generated by the current flowing through the magneto-sensitive body 20 and the magnetic field generated by the current flowing through the conductive layer 21 are cancelled out with each other, and the magnetic field $H_m$ generated by the current $I_m$ flowing through the magneto-sensitive body wiring line 4 and the magnetic field $H_c$ generated by the current $I_c$ flowing through the conductive layer wiring line 5 are cancelled with each other, so that an induced voltage to be generated in the detecting conductive wire 8 by these magnetic fields was made smaller, and thereby the output voltage $V_o$ hardly suffered superposition of the induced voltage. Also, it is found that in the sample 1, the output voltage $V_o$ has almost no variation even when the temperature varies. The reason is considered as follows. That is, due to the temperature variation, the resistances of the wiring lines 4 and 5 and the properties of the switch 19 vary to thereby vary the value of the current I. However, in the sample 1, because the magnetic fields caused by the current I were cancelled with each other, the output voltage $V_o$ does not suffer large influence even if the current I was varied.

Figure 20:
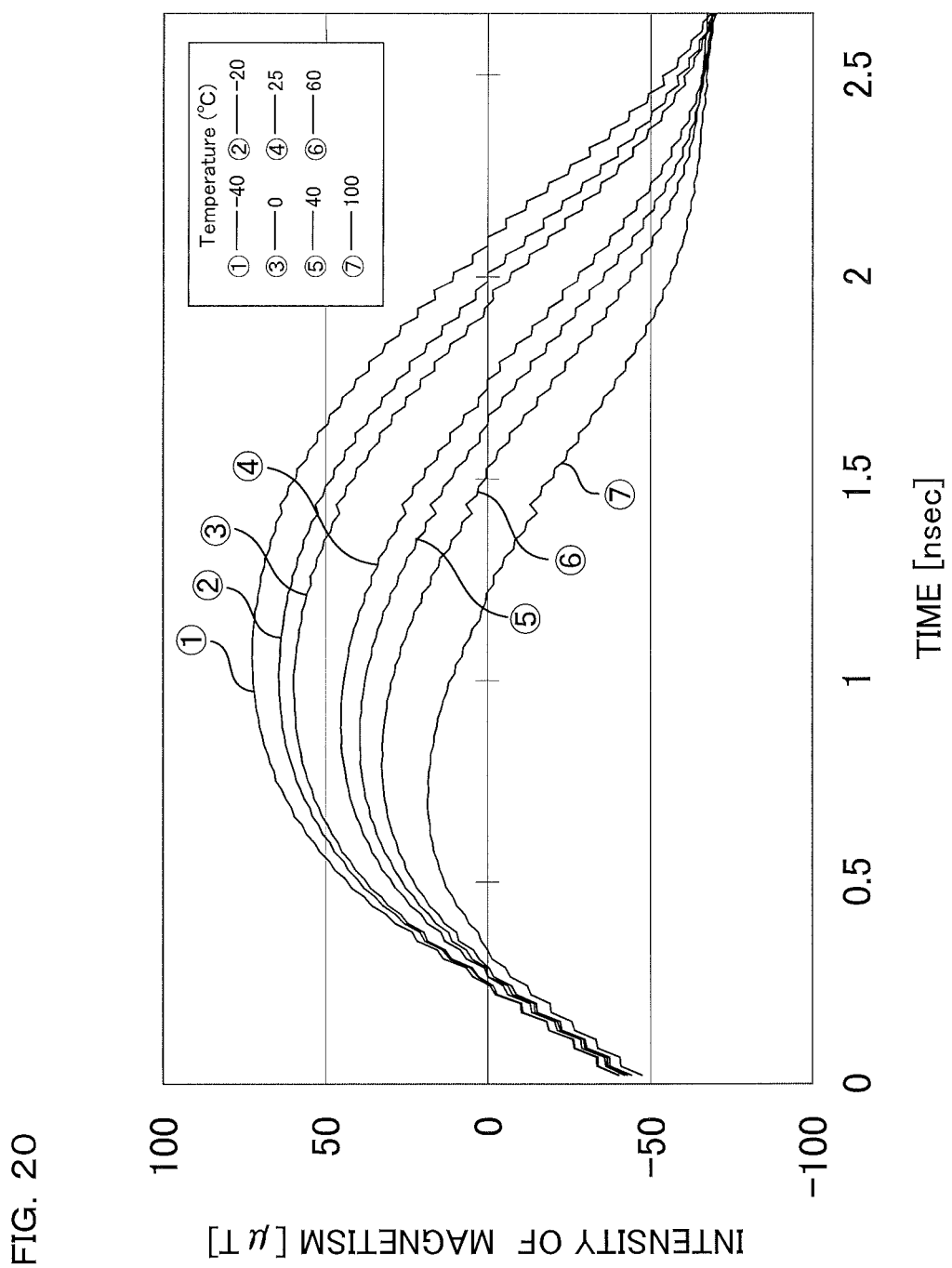
FIG. 20 shows a measurement result of the voltage of the detection coil according to Comparative Embodiment 1.

In contrast, it is found from FIG. 20 that in the comparative sample 1, the peak value of the output voltage $V_o$ is relatively high. The reason is considered as follows. That is, the magnetic fields generated from the magneto-sensitive body 20 and the wiring lines 48 and 49 are not reduced and act on the detection coil 2 and the detecting conductive wires 8. Thus, when the magnetic fields vary with time at the time when the current I is risen, or at such time, a large induced voltage is generated in the detecting conductive wires 8, etc., and superposes on the output voltage $V_o$. In addition, it is found from FIG. 20 that in the comparative sample 1, when the temperature varies, the output voltage $V_o$ largely varies.

In other words, it is found that the temperature dependency of the output voltage $V_o$ is high. It is considered because along with the temperature variation, the electrical resistances of the wiring lines 48 and 49, and the electrical properties of the switch 19 vary to thereby cause the current I to vary, so that the intensity of the magnetic field generated by this current I varies to thereby cause the induce voltage to be superposed on the output voltage $V_o$ to vary.

Next, operational effects of the present embodiment will be explained. As shown in FIG. 1, in the present embodiment, the two wiring lines 4 and 5, i.e. the magneto-sensitive body wiring line 4 and the conductive layer wiring line 5 are configured such that at least parts of the two wiring lines are adjacent to each other and allow the current I to pass therethrough in opposite directions.

According to such a configuration, the magnetic field $H_m$ generated by the current $I_m$ flowing through the magneto-sensitive wiring line 4 and the magnetic field $H_c$ generated by the current $I_c$ flowing through the conductive layer wiring line 5 can be cancelled with each other. Thus, these magnetic fields $H_m$ and $H_c$ are prevented from acting on the pair of the detecting conductive wires 8a and 8b to generate an induced voltage in the detecting conductive wires 8a and 8b. As a result, it becomes possible to accurately measure the output voltage $V_o$ of the detection coil 22 by the detection circuit 3. In this way, the accuracy of external magnetic field measurement can be improved.

In addition, the present embodiment is, as shown in FIG. 11, hardly influenced by the magnetic fields $H_m$ and $H_c$ generated by the current I flowing through the wiring lines 4 and 5, and thus the voltage measured by the detection circuit 3 is hardly varied even if the value of the current I varies with the temperature variation. Therefore, the external magnetic field can be accurately measured even when the temperature varies.

Further, the two wiring lines 4 and 5 of the present embodiment include the IC parts 4a and 5a formed on the IC 6, respectively, and the board parts 4b and 5b formed on the wiring board 7, respectively. The two wiring lines 4 and 5 are configured to be adjacent to each other both in the IC parts 4a and 5a, and in the board parts 4b and 5b.

According to such a configuration, the adjacent parts of the two wiring lines 4 and 5 may be made long in length. Thus, magnetic fields H ($H_m$ and $H_c$) generated by the current I ($I_m$ and $I_c$) flowing in these wiring lines 4 and 5 can be satisfactorily cancelled with each other to thereby lower the intensity of the magnetic field H that will act on the pair of detecting conductive wires 8a and 8b. Consequently, an induced voltage is hardly generated in the detecting conductive wires 8a and 8b, which makes it possible to measure the external magnetic field more accurately.

Still further, as shown in FIG. 4, the magneto-sensitive body wiring line 4 and the conductive layer wiring line 5 of the present embodiment are formed at the positions not to cross with the detecting conductive wires 8 (8a and 8b) when viewed in the Z direction.

Thus configured, the magneto-sensitive body wiring line 4 and the conductive layer wiring line 5 can be arranged at the positions apart from the detecting conductive wires 8. Such an arrangement can prevent generation of an induced voltage in the detecting conductive wires 8 by the magnetic field H generated from these wiring lines 4 and 5, so that it becomes possible to measure the external magnetic field more accurately.

Figure 21:
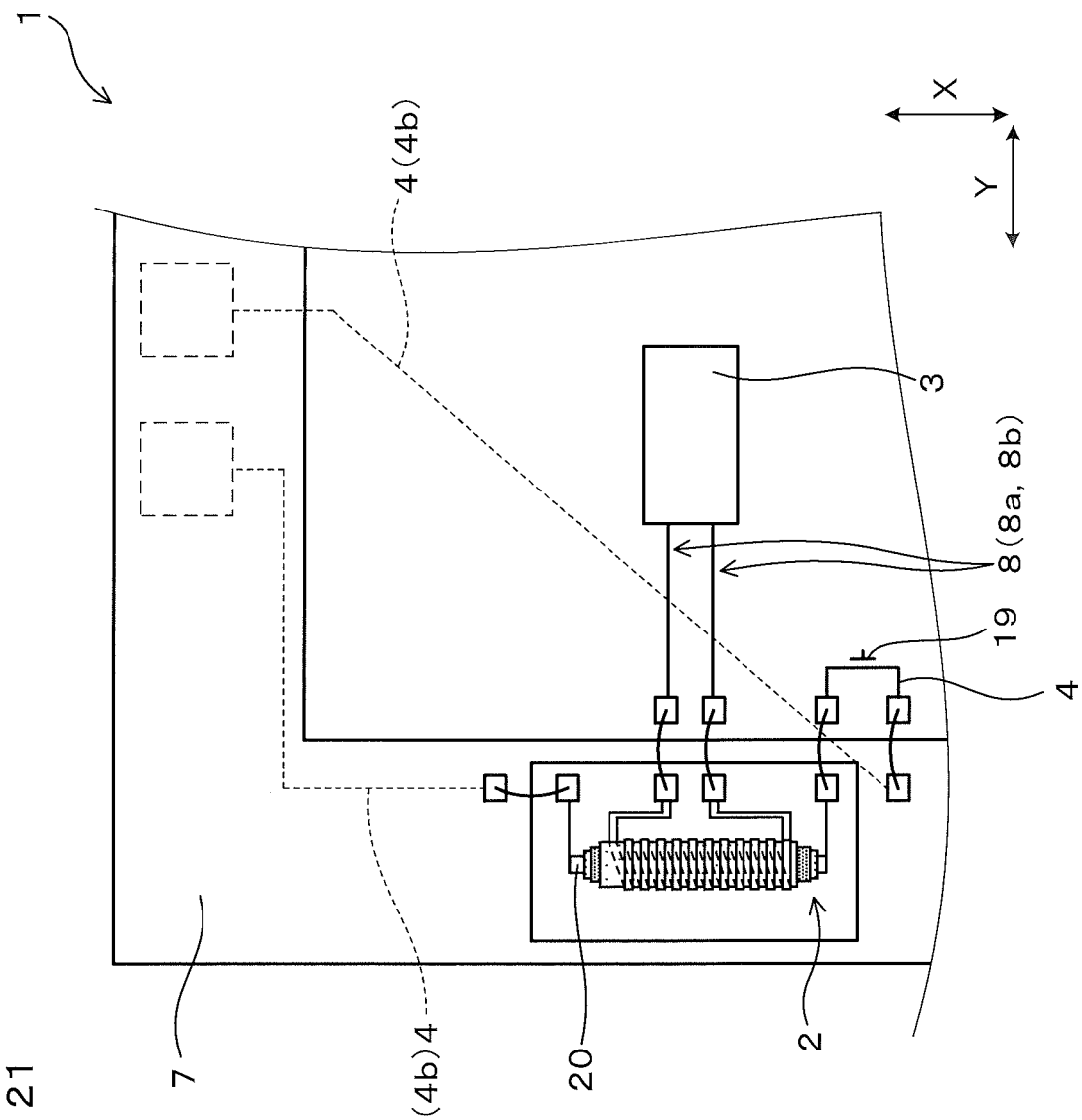
FIG. 21 is a plan view of the magneto-impedance sensor according to Comparative Embodiment 2.

In other words, if, as shown in FIG. 21, the wiring line 4 is configured to cross with the detecting conductive wires 8 when viewed in the Z direction, the wiring line 4 is close to the detecting conductive wires 8, and an induced voltage is easily generated in the detecting conductive wires 8 by the influence of the magnetic field generated from the wiring line 4. Accordingly, it becomes difficult to accurately detect the external magnetic field. In contrast, as in the present embodiment shown in FIG. 4, when the wiring lines 4 and 5 are formed at the positions not to cross with the detecting conductive wires 8 when viewed in the X direction, the wiring lines 4 and 5 can be away from the detecting conductive wires 8. As a result, an induced voltage is hardly generated in the detecting conductive wires 8, which makes it possible to measure the external magnetic field accurately.

Still further, in the present embodiment, as shown in FIG. 4, wires 10 lie between the magneto-sensitive body terminal portion 24 and the magneto-sensitive body wiring line 4, and between the conductive layer terminal portion 25 and the conductive layer wiring line 5, respectively to electrically connect therebetween. The wires 10 are formed at the positions not to cross with the detecting conductive wires 8 (8a and 8b) when viewed in the Z direction.

Thus configured, the wires 10 can be arranged at the positions apart from the detecting conductive wires 8. Accordingly, the magnetic fields generated from the wires 10 hardly act on the pair of the detecting conductive wires 8 (8a and 8b) to thereby hardly generate an induced voltage in the detecting conductive wires 8. Consequently, the external magnetic field can be measured more accurately.

Still further, as shown in FIG. 4 and FIG. 5, both ends of the IC parts 4a and 5a of the wiring lines 4 and 5 are connected to the IC terminal portions 61, and both ends of the board parts 4b and 5b are connected to the board terminal portions 71. The IC parts 4a and 5a of the two wiring line 4 and 5 are adjacent to each other except for the vicinity of the IC terminal portions 61, and the board parts 4b and 5b of the two wiring line 4 and 5 are adjacent to each other except for the vicinity of the board terminal portions 71.

Thus configured, the adjacent parts of the two wiring lines 4 and 5 can be made longer in length. Accordingly, the magnetic fields H ($H_m$ and $H_c$) generated by the current I ($I_m$ and Ic) flowing in the two wiring lines 4 and 5 can be effectively cancelled with each other. Consequently, an induced voltage is hardly generated in the detecting conductive wires 8, which makes it possible to measure the external magnetic field more accurately.

Still further, as shown in FIG. 1, in the present embodiment, the two wiring lines 4 and 5 are adjacent to each other by 50% or more. Therefore, the adjacent parts of the wiring lines 4 and 5 can be made long in length, so that the magnetic fields generated from the wiring lines 4 and 5 can be satisfactorily cancelled with each other. In this way, generation of an induced voltage in the detecting conductive wires can be effectively prevented.

It is noted that the two wiring lines 4 and 5 are preferably configured to be adjacent to each other by 80% or more.

As mentioned above, the present embodiment can provide a magneto-impedance sensor that makes it possible to further improve the accuracy of external magnetic field measurement.

Figure 12:
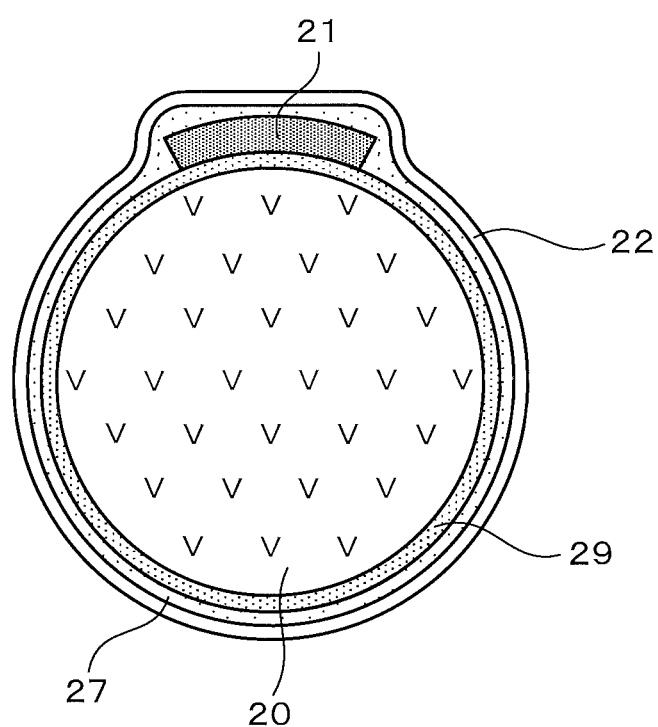
FIG. 12 is a cross-sectional view of the magneto-impedance element according to Embodiment 1 in which part of the magneto-sensitive body is covered with a conductive layer.

It is noted that in the present embodiment, as shown in FIG. 3, the MI element 2 in which the magneto-sensitive body 20 is entirely covered with the conductive layer 21 was used, however, the present invention is not limited thereto. For example, as shown in FIG. 12, the magneto-sensitive body 20 may be partly covered with the conductive layer 21. Also in this case, it is more preferable to have a symmetrical structure with respect to the axis.

Embodiment 2

Figure 13:
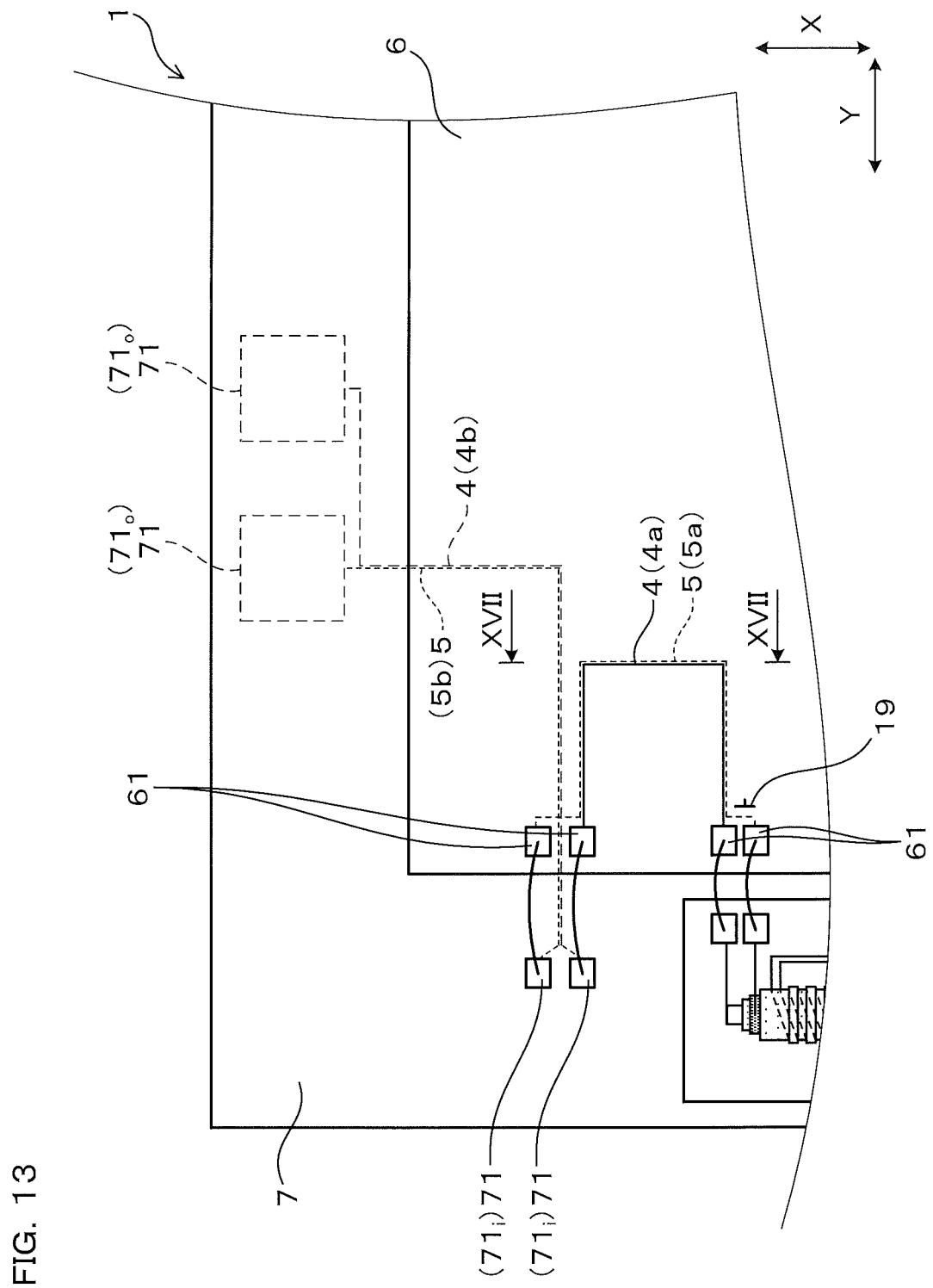
FIG. 13 is a plan view of a magneto-impedance sensor according to Embodiment 2.
Figure 14:
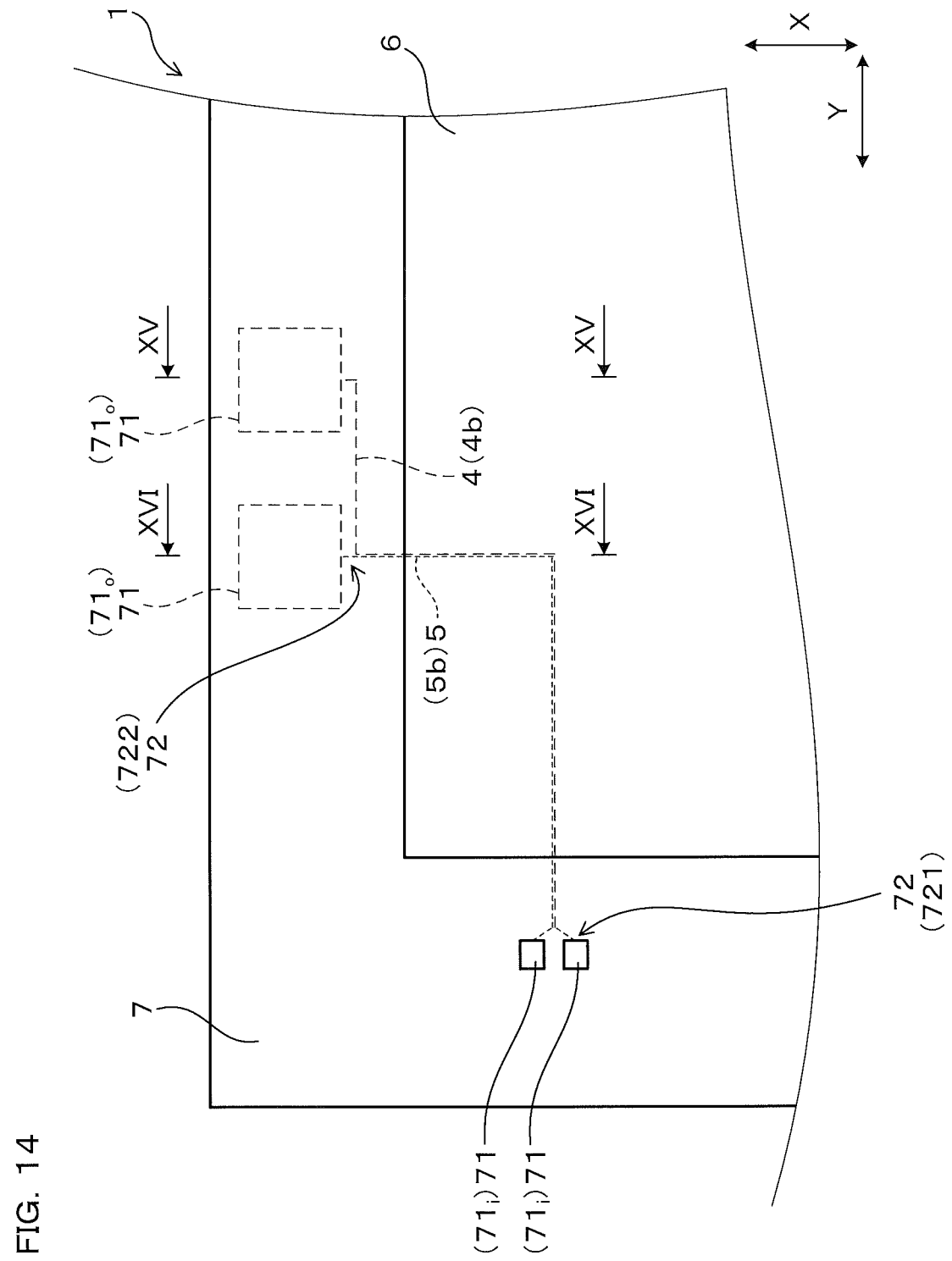
FIG. 14 is a plan view of a wiring board according to Embodiment 2.

The present embodiment is an example in which configurations of the IC 6 and the wiring board 7 are modified. As shown in FIG. 13 and FIG. 14, the wiring lines 4 and 5 of the present embodiment include the IC part 4a and 5a, and the board parts 4b and 5b, respectively in the same way as in Embodiment 1. The two IC parts 4a and 5a are adjacent to each other in the Z direction except for the vicinity of the IC terminal portions 61.

Figure 17:
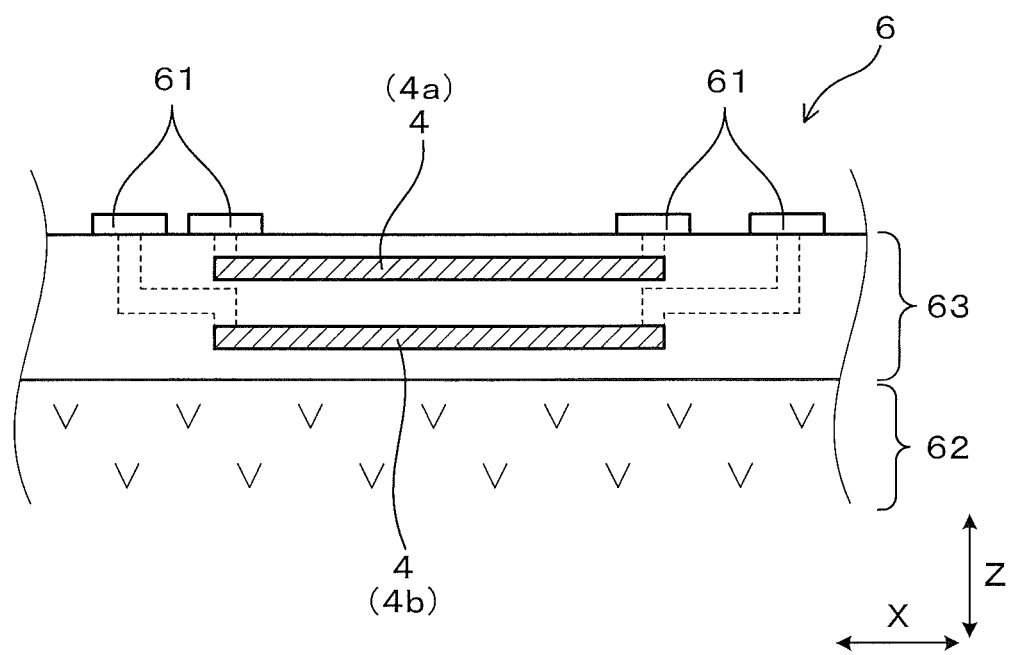
FIG. 17 is a cross-sectional view taken along the line XVII-XVII in FIG. 13.

As shown in FIG. 17, the IC 6 of the present embodiment includes the silicon substrate 62 and the wiring part 63 in the same way as in Embodiment 1. In the wiring part 63, the IC parts 4a and 5a of the wiring lines 4 and 5 are formed. The two IC parts 4a and 5a are formed at the positions to overlap with each other when viewed in the Z direction.

Figure 15:
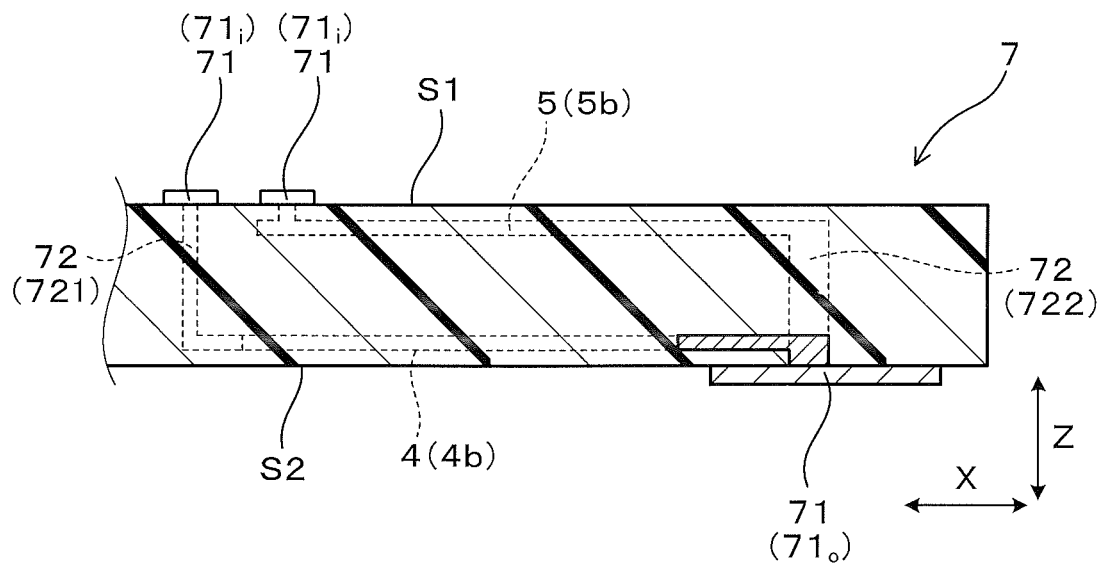
FIG. 15 is a cross-sectional view taken along the line XV-XV in FIG. 14.
Figure 16:
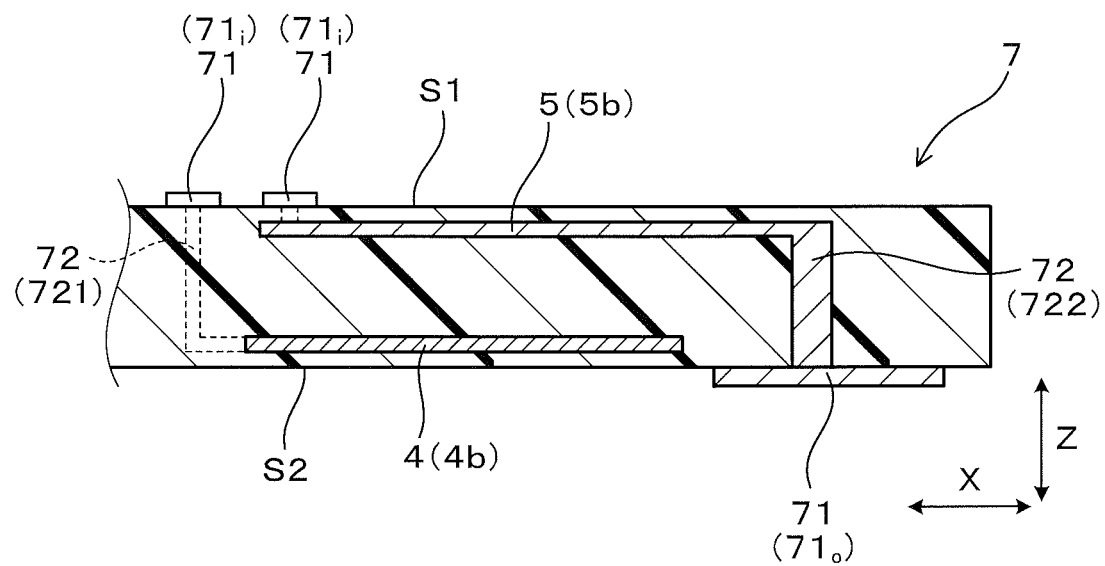
FIG. 16 is a cross-sectional view taken along the line XVI-XVI in FIG. 14.

In the similar way, as shown in FIG. 14, the board parts 4b and 5b of the wiring lines 4 and 5 are adjacent to each other except for the vicinity of the board terminal portions 71. As shown in FIG. 15 and FIG. 16, the board part 4b of the magneto-sensitive body wiring line 4 is placed at the position close to the second primary surface S2. The board part 5b of the conductive layer wiring line 5 is placed at the position close to the first primary surface S1. These board parts 4b and 5b are formed at the positions to overlap with each other when viewed in the Z direction. It is noted that the board part 4b may be formed on the first primary surface S1, and the board part 5b may be formed on the second primary surface S2.

The board part 4b of the magneto-sensitive body wiring line 4 is connected to the IC side board terminal portions 71, through a first contact part 721. The first contact part 721 is formed at the position to overlap the IC side board terminal portions 71, when viewed in the Z direction. In the similar way, the board part 5b of the conductive layer wiring line 5 is connected to the outside board terminal portions 71$_o$ through a second contact part 722. The second contact part 722 is formed at the position to overlap the outside board terminal portions 71$_o$ when viewed in the Z direction.

Operational effects of the present embodiment will be explained. The present embodiment is configured such that the two wiring lines 4 and 5 are adjacent to each other in the Z direction in the IC parts 4a and 5a, and the board parts 4b and 5b.

According to such a configuration, dimensions of the IC 6 or the wiring board 7 viewed in the Z direction can be reduced. Thus, the MI sensor 1 can be small-sized.

In addition, the same configurations and operational effects as those in Embodiment 1 are provided.

It is noted that in the present embodiment, the two IC parts 4a and 5a, and the two board parts 4b and 5b are respectively adjacent to each other in the Z direction, however, the present invention is not limited thereto. For example, either of the IC parts 4a and 5a or the board parts 4b and 5b may be adjacent to each other in the Z direction, and the other parts may be adjacent to each other in the direction orthogonal to the Z direction.

Figure 18:
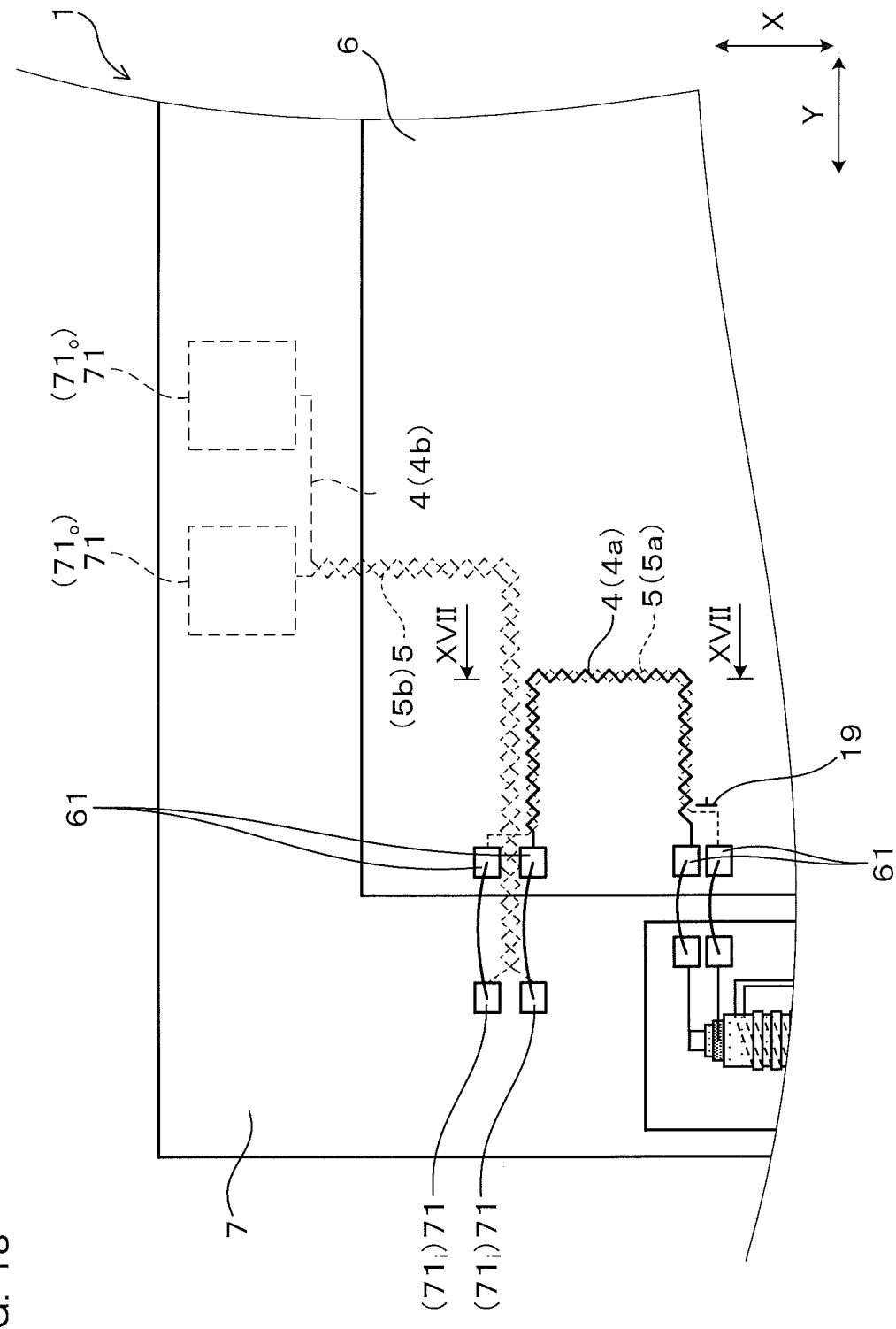
FIG. 18 is a plan view of the magneto-impedance sensor according to Embodiment 2, which is configured to have a magneto-sensitive body wiring line and a conductive layer wiring line obliquely crossed with each other when viewed in the thickness direction.

And, as shown in FIG. 13, in the present embodiment, the two wiring lines 4 and 5 are adjacent to each other entirely in the Z direction except for the vicinity of the IC terminal portions 61 and the board terminal portions 71, however, the present invention is not limited thereto. Specifically, as shown in FIG. 18, the two wiring lines 4 and 5 may be configured to cross with each other obliquely and alternately in the Z direction when viewed in the Z direction. In such a configuration, the two wiring lines 4 and 5 form a similar structure to so-called twisted pair wires, so that the magnetic fields generated from the two wiring lines 4 and 5 can be effectively cancelled with each other.

The invention claimed is:

1. A magneto-impedance sensor, comprising:
   a magneto-impedance element that includes a magneto-sensitive body, a conductive layer arranged at a position adjacent to the magneto-sensitive body with an insulating layer being interposed therebetween, a detection coil wound around the magneto-sensitive body, a connecting part electrically connecting the magneto-sensitive body and the conductive layer at one ends thereof in an axial direction of the magneto-sensitive body, a magneto-sensitive body terminal portion electrically connected to an other end of the magneto-sensitive body in the axial direction, and a conductive layer terminal portion electrically connected to an other end of the conductive layer in the axial direction, and that is configured to allow the magneto-sensitive body and the conductive layer to pass a current therethrough in opposite directions;
   a detection circuit electrically connected to the detection coil through a pair of detecting conductive wires to detect an output voltage of the detection coil;
   a magneto-sensitive body wiring line electrically connected to the magneto-sensitive body terminal portion; and
   a conductive layer wiring line electrically connected to the conductive layer terminal portion,
   wherein two wiring lines of the magneto-sensitive body wiring line and the conductive layer wiring line are configured such that parts of the two wiring lines are adjacent to each other and allow the current to pass therethrough in opposite directions, and
   wherein the respective parts of the two wiring lines of the magneto-sensitive body wiring line and the conductive layer wiring line are sufficiently close to one another that a magnetic field generated by a current flowing through the part of the magneto-sensitive body wiring line, and a magnetic field generated by a current flowing through the part of the conductive layer wiring line, cancel each other.

2. The magneto-impedance sensor according to claim 1, further comprising an IC in which the detection circuit is formed, and a wiring board on which the magneto-impedance element and the IC is mounted, each of the two wiring lines being composed of an IC part formed on the IC and a board part formed on the wiring board, and the two wiring lines being configured to be adjacent to each other both in the IC parts and the board parts.

3. The magneto-impedance sensor according to claim 2, wherein the two wiring lines are adjacent to each other in a thickness direction of the IC in at least either of the IC parts or the board parts.

4. The magneto-impedance sensor according to claim 2, wherein the magneto-sensitive body wiring line and the conductive layer wiring line are formed at such positions as not to cross with the detecting conductive wires when viewed in the thickness direction of the IC.

5. The magneto-impedance sensor according to claim 3, wherein wires lie between the magneto-sensitive body terminal portion and the magneto-sensitive body wiring line, and between the conductive layer terminal portion and the conductive layer wiring line, respectively to electrically connect therebetween, the wires being formed at such positions as not to cross with the detecting conductive wires when viewed in the thickness direction of the IC.

6. The magneto-impedance sensor according to claim 2, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

7. The magneto-impedance sensor according to claim 3, wherein wires lie between the magneto-sensitive body terminal portion and the magneto-sensitive body wiring line, and between the conductive layer terminal portion and the conductive layer wiring line, respectively to electrically connect therebetween, the wires being formed at such positions as not to cross with the detecting conductive wires when viewed in the thickness direction of the IC.

8. The magneto-impedance sensor according to claim 4, wherein wires lie between the magneto-sensitive body terminal portion and the magneto-sensitive body wiring line, and between the conductive layer terminal portion and the conductive layer wiring line, respectively to electrically connect therebetween, the wires being formed at such positions as not to cross with the detecting conductive wires when viewed in the thickness direction of the IC.

9. The magneto-impedance sensor according to claim 5, wherein wires lie between the magneto-sensitive body terminal portion and the magneto-sensitive body wiring line, and between the conductive layer terminal portion and the conductive layer wiring line, respectively to electrically connect therebetween, the wires being formed at such positions as not to cross with the detecting conductive wires when viewed in the thickness direction of the IC.

10. The magneto-impedance sensor according to claim 2, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

11. The magneto-impedance sensor according to claim 3, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

12. The magneto-impedance sensor according to claim 4, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

13. The magneto-impedance sensor according to claim 5, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

14. The magneto-impedance sensor according to claim 6, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

15. The magneto-impedance sensor according to claim 7, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

16. The magneto-impedance sensor according to claim 8, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

17. The magneto-impedance sensor according to claim 9, wherein both ends of the IC parts are connected to IC terminal portions formed on the IC, and both ends of the board parts are connected to board terminal portions formed on the wiring board, the IC parts of the two wiring lines being adjacent to each other except for the vicinity of the IC terminal portions, and the board parts of the two wiring lines being adjacent to each other except for the vicinity of the board terminal portions.

* * * * *